US009507250B2

(12) United States Patent
Agarwal et al.

(10) Patent No.: US 9,507,250 B2
(45) Date of Patent: Nov. 29, 2016

(54) OPTICAL PROXIMITY CORRECTION FOR IMPROVED ELECTRICAL CHARACTERISTICS

(75) Inventors: Kanak B. Agarwal, Austin, TX (US); Sani R. Nassif, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1038 days.

(21) Appl. No.: 12/640,166

(22) Filed: Dec. 17, 2009

(65) Prior Publication Data

US 2011/0154271 A1 Jun. 23, 2011

(51) Int. Cl.
*G06F 17/50* (2006.01)
*G03F 1/00* (2012.01)
*G03F 1/36* (2012.01)

(52) U.S. Cl.
CPC ............ *G03F 1/144* (2013.01); *G03F 1/36* (2013.01)

(58) Field of Classification Search
CPC ...... G03F 1/36; G03F 1/144; G06F 17/5068; G06F 17/5081
USPC ................................... 716/50–55; 430/5, 30
See application file for complete search history.

(56) References Cited

U.S. PATENT DOCUMENTS

| | | | |
|---|---|---|---|
| 6,584,609 B1 * | 6/2003 | Pierrat et al. .................... 716/52 |
| 6,763,514 B2 * | 7/2004 | Zhang .............................. 716/53 |
| 6,785,879 B2 * | 8/2004 | Pierrat ....................... G03F 1/36 430/5 |
| 6,789,879 B2 * | 9/2004 | Khalid ................. G06K 15/102 347/43 |
| 7,024,655 B2 * | 4/2006 | Cobb ............................... 716/52 |
| 7,149,999 B2 | 12/2006 | Kahng et al. |
| 7,165,234 B2 * | 1/2007 | Pierrat ....................... G03F 1/36 430/5 |
| 7,325,225 B2 | 1/2008 | Tanaka et al. |
| 7,340,706 B2 * | 3/2008 | Golubtsov .............. G03F 1/144 716/52 |
| 7,350,183 B2 | 3/2008 | Cui et al. |
| 7,383,521 B2 * | 6/2008 | Smith et al. ................... 716/114 |
| 7,627,837 B2 * | 12/2009 | Zhang .............................. 716/53 |
| 7,694,267 B1 * | 4/2010 | Ye et al. .......................... 716/53 |
| 8,572,517 B2 * | 10/2013 | Pramanik ................ G03F 1/144 716/50 |
| 8,739,080 B1 * | 5/2014 | Tsai .................... G06F 17/5068 430/30 |

(Continued)

OTHER PUBLICATIONS

Postnikov, "Critical dimension control in optical lithography," Microelectronic Engineering 69, 2003.

(Continued)

*Primary Examiner* — Paul Dinh
(74) *Attorney, Agent, or Firm* — Garg Law Firm, PLLC; Rakesh Garg; William J. Stock (57) ABSTRACT

A method, computer program product, and data processing system for performing an improved optical proximity correction are disclosed, which better respect the electrical properties of the device being manufactured. A preferred embodiment of the present invention performs OPC by first dividing the perimeter of a mask region into a plurality of segments, then grouping the segments into at least two distinct groups, wherein segments in the first of these groups are adjusted in position so as to minimize edge placement error (EPE) when the photolithography using the mask is simulated. Segments in the second group are adjusted in position so as to minimize cumulative error in a dimension spanning the region, wherein the span of such dimension extends from segments in the first group to segments in the second group. Correction so obtained by this process more readily preserves the intended electrical behavior of the original device design.

20 Claims, 8 Drawing Sheets

(56) References Cited

U.S. PATENT DOCUMENTS

| | | | |
|---|---|---|---|
| 2003/0229868 A1* | 12/2003 | White et al. | 716/5 |
| 2005/0097501 A1* | 5/2005 | Cobb | G03F 1/36 716/52 |
| 2005/0198598 A1* | 9/2005 | Adam | G03F 1/36 716/53 |
| 2005/0202326 A1* | 9/2005 | Gordon | G03F 1/36 430/30 |
| 2006/0190854 A1 | 8/2006 | Watt | |
| 2007/0079277 A1* | 4/2007 | Golubtsov | G03F 1/144 716/52 |
| 2007/0231710 A1 | 10/2007 | Aton et al. | |
| 2008/0263483 A1 | 10/2008 | Koike et al. | |
| 2009/0024968 A1 | 1/2009 | Yamada et al. | |
| 2009/0031261 A1* | 1/2009 | Smith et al. | 716/2 |
| 2009/0166746 A1 | 7/2009 | Mitani et al. | |
| 2009/0199151 A1* | 8/2009 | Banerjee et al. | 716/20 |
| 2010/0122231 A1* | 5/2010 | Agarwal et al. | 716/19 |
| 2010/0333049 A1* | 12/2010 | Agarwal et al. | 716/55 |
| 2012/0072874 A1* | 3/2012 | Chiang | G06F 17/5068 716/52 |
| 2013/0042212 A1* | 2/2013 | Wong | G03F 1/144 716/54 |

OTHER PUBLICATIONS

IBM, "Optimization of mask-rule-limited Optical Proximity Correction," 1 Jun. 5, 2004.

Banerjee, S et al, Compensating non-optical effects using electrically-driven optical proximity correction, Issue Title: Design for Manufacturability through Design-Process Integration III, Proceedings of SPIE—The International Society for Optical (United States ) 2009 72751—Article No. 72750E,ISBN: 9780819475282.

Teh, S.-H et al., Design-process integration for performance-based OPC framework, issue Title: Proceedings of the 45th Design Automation Conference, DAC, ( United States ) 2008 , CFPOSDAC-CDR (522-527), Article No. 4555872, Institute of Electrical and Electronics Engineers Inc. , ISBN: 9781605581156.

Ryoo, Manhyoung et al., Pattern asymmetry correction using assist patterns, Proceedings of SPIE—The International Society for Optical Engineering 2000 4000/- (I/-), Society of Photo-Optical Instrumentation Engineers, Pubfication Date: Dec. 3, 2000, CODEN: PSISD ISSN: Q277-786X.

Choi, S.-H et al., Simulation-based critical area extraction and litho-friendly layout design for low kl lithography, Proceedings of SPf E—The International Society for Optical Engineering ( United States ) 2OO4 5377IPART 2 (713-720), Publisher:SPIE, Publication Date:Aug. 20, 2004, CODEN:PSISD ISSN:0277'786X.

* cited by examiner

OPTICAL PROXIMITY CORRECTION FOR IMPROVED ELECTRICAL CHARACTERISTICS

BACKGROUND OF THE INVENTION

1. Technical Field

The present invention relates generally to computer-aided design of photolithographic masks used in the manufacturing of integrated circuits. More specifically, the present invention is directed to an improved method, computer program product, and apparatus for performing optical proximity correction in such masks.

2. Description of the Related Art

Integrated circuits (ICs) are commonly manufactured through a photolithographic process. In photolithography, a layer of light-sensitive material (photoresist) is applied atop a layer of material to be etched by the process. A geometric pattern is applied to the photoresist by shining light of a prescribed wavelength through a photolithographic mask (also referred to as a "photomask" or, simply, "mask") containing the pattern. A photomask is an opaque plate with holes or transparencies that allow light to shine through in a defined pattern. (Henceforth herein, the term "region of transparency" shall be used to denote either a hole in the plate or an actual transparent portion of the plate, so that a single term may be used to refer to either possibility. A "region of opacity" shall be used to denote an opaque feature in the photomask. The term "region" shall be used to denote either a region of transparency or a region of opacity.) In practice, lithographic photomasks are typically transparent fused silica blanks covered with a pattern defined with a chrome metal absorbing film. They are typically manufactured to a size that is substantially larger than that of the circuit itself, and reduction optics are used to project the mask pattern onto the photoresist at the correct size. The light passing through the mask causes changes to occur in the photoresist such that a subsequent etching process leaves selected portions of the photoresist and immediately underlying material layer intact, while removing undesired portions of such layers. For example, photolithography can be used to define the geometric pattern of the polysilicon layer in a MOS (metal-oxide semiconductor) integrated circuit technology (the layer in which the gates of MOSFETs [metal-oxide semiconductor field-effect transistors] are defined).

Figure 1:
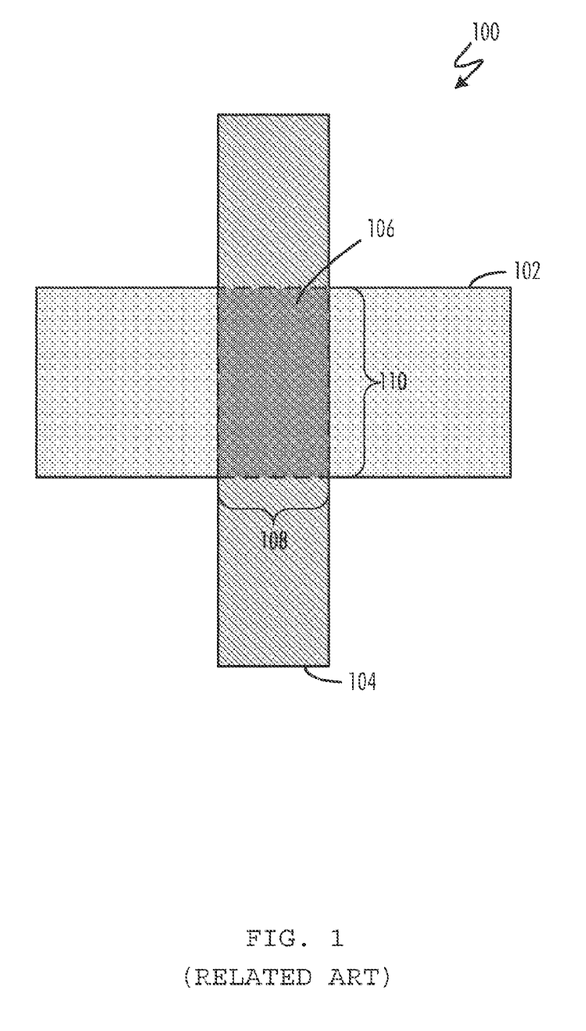
FIG. 1 is a diagram illustrating the silicon layout of a simple MOSFET.

FIG. 1, for example, depicts the IC layout of a simple MOSFET 100. MOSFET 100 is made up of a region of doped silicon 102 (either N-type or P-type) overlapped by a region of polysilicon material 104. The gate of the transistor is defined by the rectangular portion (106) of polysilicon region 104 that overlaps doped silicon region 102. In the standard Shichman-Hodges MOSFET model, the electrical behavior of the MOSFET thus constructed is modeled by a parameter "K," which is directly proportional to the ratio of the width (108) of gate 106 to its length (110). Thus, the relative dimensions of transistor features are critical to the proper electrical behavior of a given device.

Figure 2:
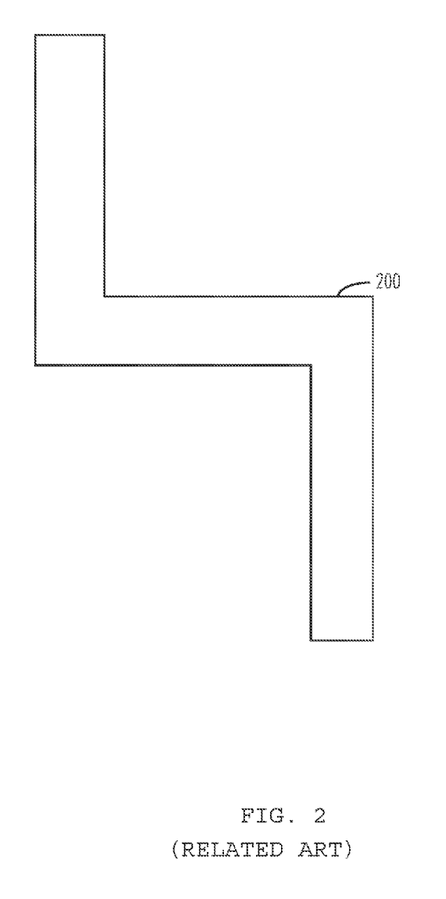
FIG. 2 is a diagram illustrating an exemplary rectilinear region in a photomask.
Figure 3:
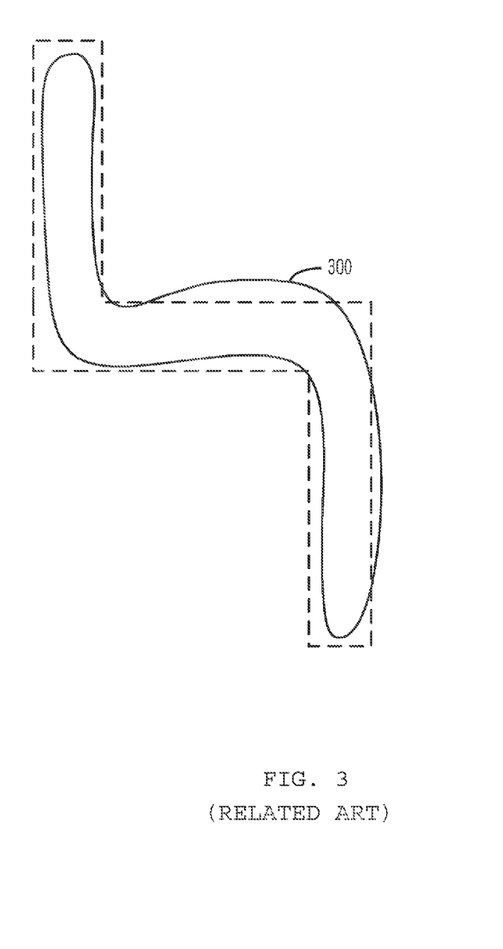
FIG. 3 is a diagram illustrating diffraction-induced distortions in the projected image obtained from a photomask at the sub-micron level.

The minimum feature sizes available in a given technology are limited, at least in part, by the nature of the photolithographic process itself. Specifically, as feature sizes approach the wavelengths of light used in the process (e.g., at sub-micron feature sizes for conventional photolithography using ultraviolet light), diffraction (a result of the wave-nature of electromagnetic radiation) reduces the fidelity of the image projected onto the photoresist. For example, a rectilinear feature 200 in a photomask (existing either as a region of transparency or as a region of opacity), as depicted in FIG. 2, might be rendered in a distorted curvilinear shape (such as shape 300) in the photoresist, as depicted in FIG. 3.

Figure 4:
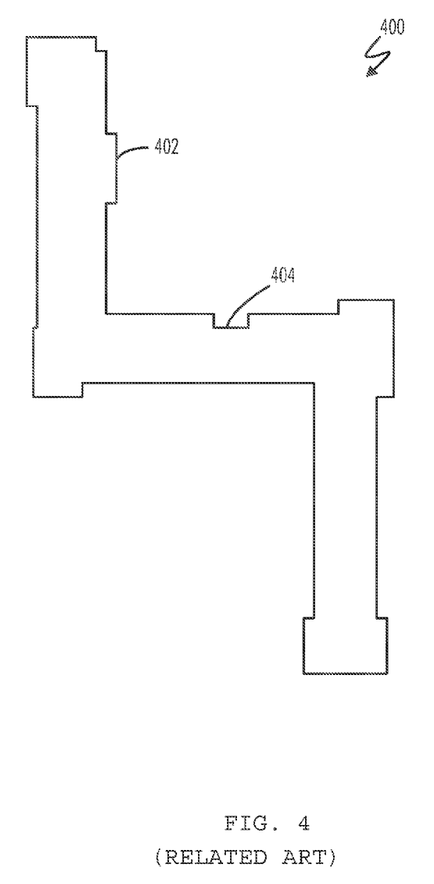
FIG. 4 is a diagram of an exemplary region in a photomask design that is a possible result of applying optical proximity correction (OPC) to the photomask design in FIG. 2.

One potential way of dealing with this problem is to shorten the wavelengths of light used. Thus, the use of extremely short-wavelength ultraviolet radiation or X-ray radiation for photolithography is a topic of current research. Another method of dealing with this problem is to employ what has come to be known as optical proximity correction (OPC). In OPC, diffusion-induced distortions in the pattern applied to the photoresist are reduced in severity by introducing small irregularities into the mask itself. The effect of these irregularities is to "predistort" the mask pattern in such a way that the diffraction-induced distortions are minimized. For example, in FIG. 4, an OPC-modified version 400 of mask pattern 200 is depicted, wherein irregularities (e.g., irregularities 402 and 404) are introduced into the mask shape so as to counteract the distortions caused by diffraction. OPC, as it is practiced in the art, relies on computerized optimization algorithms to minimize "edge placement error" (EPE). EPE is a metric that represents the distance between a location on the projected image and a corresponding location in the mask pattern. In a typical implementation, modifications to the mask pattern are made using a gradient-descent approach to minimize the overall EPE of a mask pattern.

Although EPE-based OPC is a useful technique, the results obtained from such technique are not necessarily optimal in the sense of electrical behavior. More specifically, although the projected image may better conform to the desired shape, the electrical behavior of the resulting device may differ substantially from what is desired, thus necessitating complex electrical simulation and further adjustment of the mask pattern in response.

What is needed, therefore, is a method of performing optical proximity correction which respects the electrical properties of the device being manufactured. The present invention provides a solution to this and other problems, and offers other advantages over previous solutions.

SUMMARY OF THE INVENTION

Accordingly, the present invention provides a method, computer program product, and data processing system for performing an improved optical proximity correction that better respects the electrical properties of the device being manufactured. Specifically, the present invention recognizes that the electrical properties of a given device are a function of its dimensions (size), as opposed to its edge positions (shape). In particular, a preferred embodiment of the present invention performs OPC by first dividing the perimeter of a mask region in an integrated circuit into a plurality of segments, then grouping the segments into at least two distinct groups, wherein segments in the first of these groups are adjusted in position so as to minimize edge placement error (EPE) when the photolithography using the mask is simulated. Segments in the second group are adjusted in position so as to minimize cumulative error in a dimension spanning the region, wherein the span of such dimension extends from segments in the first group to segments in the second group. Optical Proximity Correction so obtained by this process, because such correction is obtained with reference to desired dimensions, as opposed to merely position, more readily preserves the intended electrical behavior of the device as originally designed (before the correction took place).

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings, wherein.

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 5:
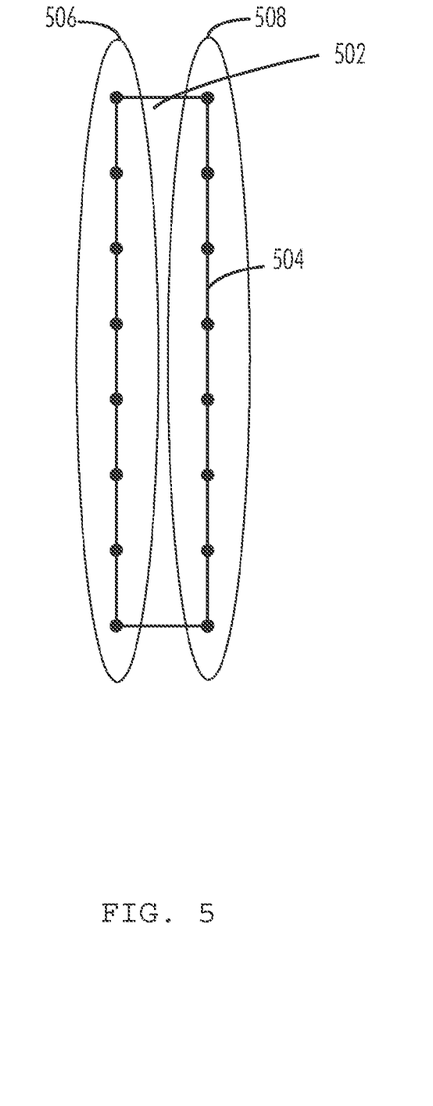
FIG. 5 is a diagram illustrating a step of dividing a perimeter of a region into a plurality of segments and further grouping those segments for electrically-motivated optical proximity correction in accordance with a preferred embodiment of the present invention.

Operation of a preferred embodiment of the present invention is illustrated with respect to an exemplary feature or "region" 502 in a photomask pattern. For the purpose of this example, a purely rectangular region is selected, which would be representative of a simple polysilicon layer utilized to form the gate of a single MOSFET, such as MOSFET 100 in FIG. 1. The process of performing optical proximity correction in this preferred embodiment of the invention begins with the division of the perimeter of region 502 into a plurality of segments, such as segment 504. These segments are then grouped into two groups, shown here as group 506 and group 508. One of these groups (we will choose group 506 in this example) will have the positions of its segments adjusted as to minimize edge placement error (EPE), whereas the other group (group 508) will have the positions of its segments adjusted so as to minimize dimensional error.

Figure 6:
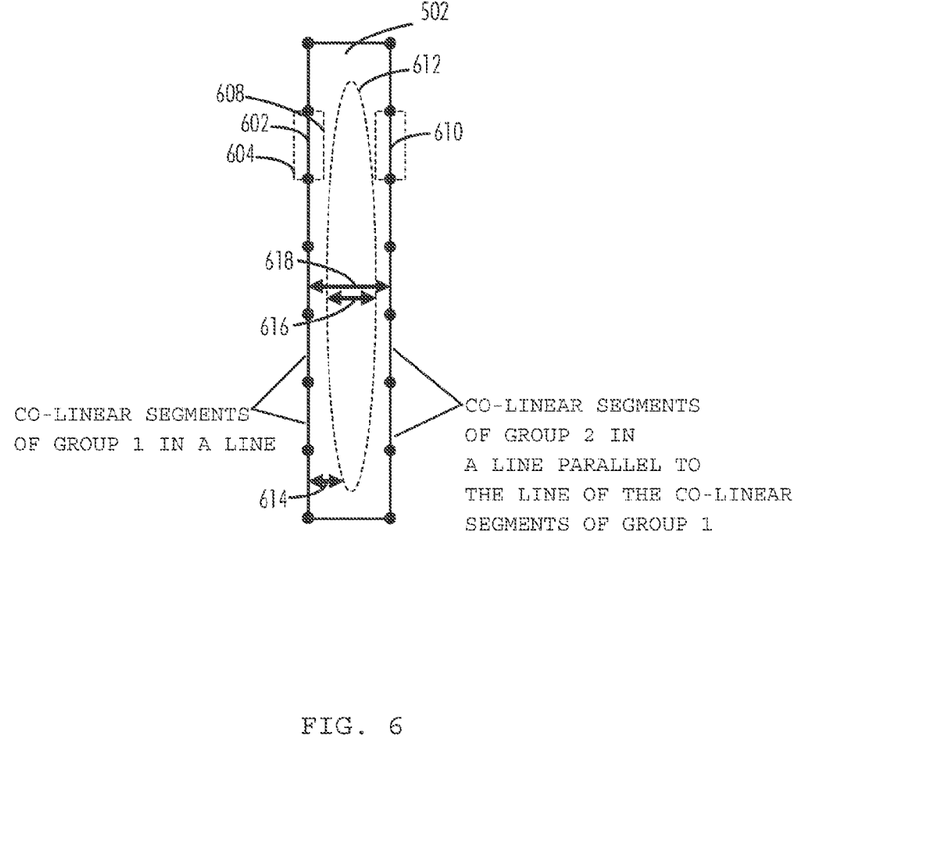
FIG. 6 is a diagram illustrating a step of preparing various modified versions of a region for the purpose of simulating the effects of various segment adjustments in accordance with a preferred embodiment of the present invention.

The actual process of determining which corrections to make to region 502 is illustrated in FIG. 6. Each segment is considered individually in this process. In this example, we will start with segment 602, which is a segment that is to be adjusted for minimal edge placement error (EPE) because it belongs to group 506 (as shown in the previous figure)—we will refer to this type of adjustment as "edge-optimization." To perform the adjustment, a photolithography simulation is first performed on region 502 to obtain a simulated printed contour 612. If the printed contour generated from the simulation (contour 612) is within the boundary of the desired shape (as shown in FIG. 6), segment 602 is displaced outward, thus replacing segment 602 with an outwardly extending serif 604. In the opposite case, where the simulation contour extends outside of the boundary of the desired shape, segment 602 would instead be replaced with a concave notch 608. The size of the notch or serif generated, in either case, is computed as a function of the magnitude of the edge placement error of segment 602 (so that greater errors result in greater displacements, for instance).

For the segments in group 508 (for example, segment 610), the same simulation data is used. However, for these segments, the choice of positional adjustment is made not for the purpose of minimizing EPE, but for the purpose of minimizing the dimensional error for each segment. In this example, the dimensional error at a single point would, in a preferred embodiment, be the difference between width 618 (the width of the desired shape at that point) and width 616 (the width of the simulated shape at the same point). If the dimensional error for segment 610, for example, indicates that the printed contour is too narrow between segment 602 and segment 610, segment 610 can be replaced with a convex serif. If the contour is too wide, on the other hand, segment 610 can be replaced with a concave notch. As with the EPE-optimized segments, the size of each notch or serif created is a function of the magnitude of the error associated with that segment.

Figure 7:
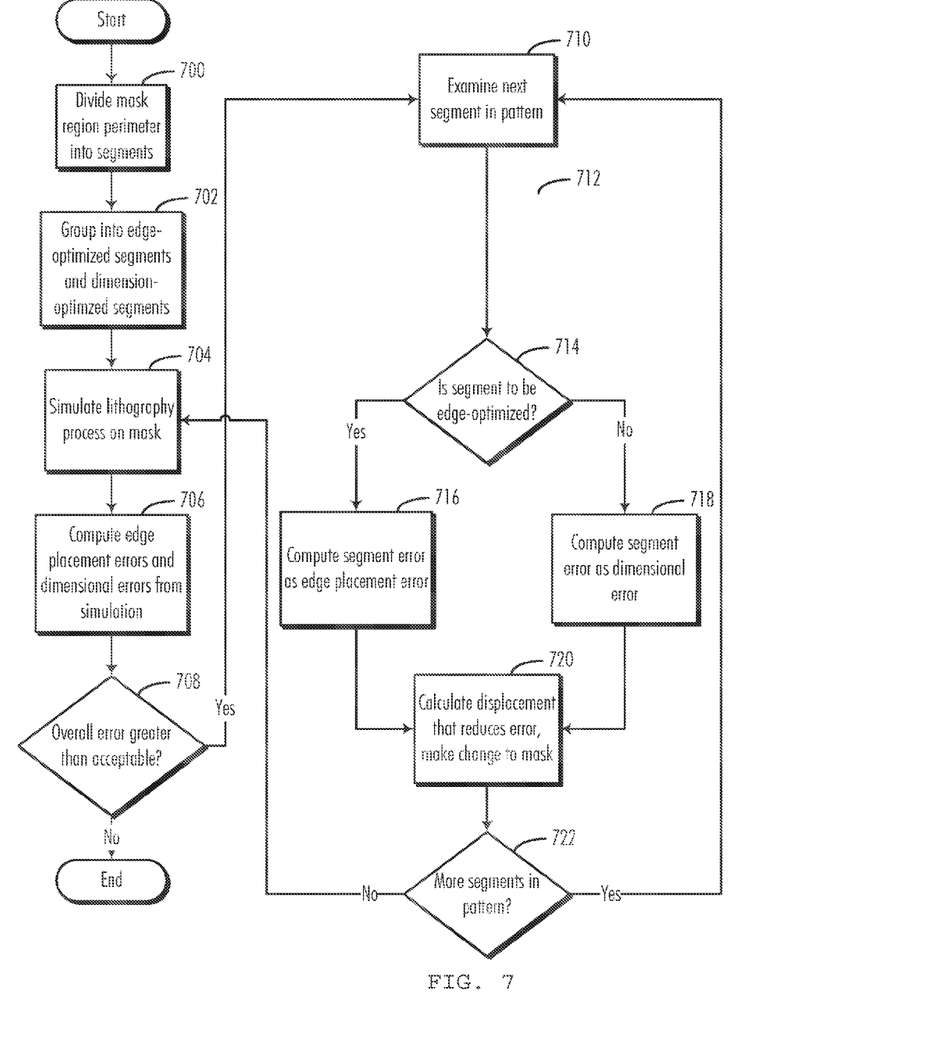
FIG. 7 is a flowchart representation of a process of performing electrically-motivated optical proximity correction in accordance with a preferred embodiment of the present invention.

This overall process is depicted in more complete detail in FIG. 7, where it is presented in flowchart form. Given a region (feature) for which OPC is to be performed, the perimeter of that region is divided into a plurality of segments (block 700). These segments are then grouped into "edge-optimized" and "dimension-optimized" groups (block 702). Then, the photolithographic process is simulated on the current mask (block 704) and an EPE score and dimensional error score are computed from this simulation (block 706). If these error scores are acceptable (i.e., there is no more than an acceptable level of overall error), the process terminated (block 708: No), but if the error scores exceed acceptable levels, the process continues to consider each segment in the region individually.

Thus, the next segment in the region is examined (block 710). A determination is then made as to whether the segment is to be "edge-optimized." If so (block 714: Yes), then the "error" score for each displacement is calculated as the EPE score for that displacement (block 716). If not, however, (block 714: No), the "error" score for each displacement is calculated as the dimensional error score for that displacement (block 718).

A displacement that reduces the "error" score (either EPE or displacement, depending on context) for that segment is then computed on the basis of the determined error and the photomask design adjusted according to that choice (block 720). If there are more segments in the region to be considered (block 722: Yes), the process loops back to block 710 to consider the next segment. If not (block 722: No), the process returns to block 704 to determine the over all acceptability of the design as modified.

In an alternative embodiment of the present invention, a gradient-descent search method may be used to optimize the mask according to global objective functions. In this alternative embodiment, for each segment, simulations are run for different displacements (inward or outward) and the displacement that, according to the simulation, minimizes the overall EPE or dimensional error (depending on the segment in question) is chosen.

Figure 8:
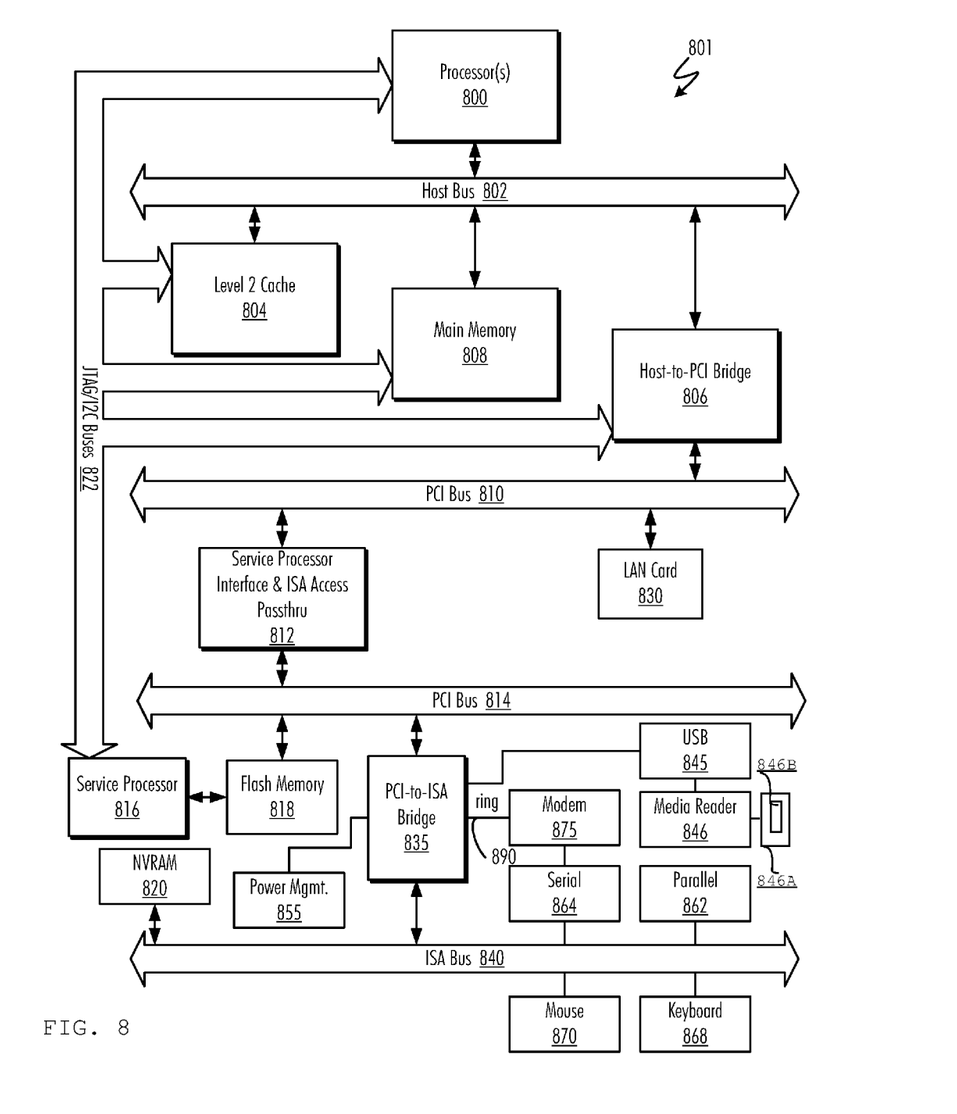
FIG. 8 is a diagram of a data processing system in which a preferred embodiment of the present invention may be implemented.

FIG. 8 illustrates information handling system 801 which is a simplified example of a computer system/data processing system capable of performing the computing operations described herein with respect to a preferred embodiment of the present invention. Computer system 801 includes processor 800 which is coupled to host bus 802. A level two (L2) cache memory 804 is also coupled to host bus 802. Host-to-PCI bridge 806 is coupled to main memory 808, includes cache memory and main memory control functions, and provides bus control to handle transfers among PCI bus 810, processor 800, L2 cache 804, main memory 808, and host bus 802. Main memory 808 is coupled to Host-to-PCI bridge 806 as well as host bus 802. Devices used solely by host processor(s) 800, such as LAN card 830, are coupled to PCI bus 810. Service Processor Interface and ISA Access Pass-through 812 provides an interface between PCI bus 810 and PCI bus 814. In this manner, PCI bus 814 is insulated from PCI bus 810. Devices, such as flash memory 818, are coupled to PCI bus 814. In one implementation, flash memory 818 includes BIOS code that incorporates the necessary processor executable code for a variety of low-level system functions and system boot functions.

PCI bus 814 provides an interface for a variety of devices that are shared by host processor(s) 800 and Service Processor 816 including, for example, flash memory 818. PCI-to-ISA bridge 835 provides bus control to handle transfers between PCI bus 814 and ISA bus 840, universal serial bus (USB) functionality 845, power management functionality 855, and can include other functional elements not shown, such as a real-time clock (RTC), DMA control, interrupt support, and system management bus support. Nonvolatile RAM 820 is attached to ISA Bus 840. Service Processor 816 includes JTAG and I2C buses 822 for communication with processor(s) 800 during initialization steps. JTAG/I2C buses 822 are also coupled to L2 cache 804, Host-to-PCI bridge 806, and main memory 808 providing a communications path between the processor, the Service Processor, the L2 cache, the Host-to-PCI bridge, and the main memory. Service Processor 816 also has access to system power resources for powering down information handling device 801.

Peripheral devices and input/output (I/O) devices can be attached to various interfaces (e.g., parallel interface 862, serial interface 864, keyboard interface 868, and mouse interface 870 coupled to ISA bus 840. USB hub 845, for instance, is shown connected to a media reader 846 for the purpose of reading machine-readable tangible data storage media, e.g., data storage medium 846A, such as memory cards, optical discs, and the like. Alternatively, many I/O devices can be accommodated by a super I/O controller (not shown) attached to ISA bus 840.

In order to attach computer system 801 to another computer system to copy files over a network, LAN card 830 is coupled to PCI bus 810. Similarly, to connect computer system 801 to an ISP to connect to the Internet using a telephone line connection, modem 875 is connected to serial port 864 and PCI-to-ISA Bridge 835.

While the computer system described in FIG. 8 is capable of executing the processes described herein, this computer system is simply one example of a computer system. Those skilled in the art will appreciate that many other computer system designs are capable of performing the processes described herein.

One of the preferred implementations of the invention is a computer program, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), e.g., computer program product 846B in data storage medium 846A, or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information that imparts functionality to a machine, namely executable computer code.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an;" the same holds true for the use in the claims of definite articles. Where the word "or" is used in the claims, it is used in an inclusive sense (i.e., "A and/or B," as opposed to "either A or B").

What is claimed is:

1. A computer-implemented method of correcting a design of a photomask to account for diffraction, the method comprising:
   dividing, in an application executing using a processor and a memory, a perimeter of a region within the photomask into a plurality of segments;
   grouping the plurality of segments into a first group and a second group;
   adjusting positions of segments from the first group such that an edge placement error is minimized; and adjusting positions of segments from the second group such that an error in a physical dimension spanning at least a portion of the region is minimized.

2. The computer-implemented method of claim 1, wherein the physical dimension is a width of the at least a portion of the region.

3. The computer-implemented method of claim 1, wherein the segments from the first group, prior to said adjusting positions of segments from the first group, are co-linear with each other; and wherein the segments from the second group, prior to said adjusting positions of segments from the second group, are co-linear with each other.

4. The computer-implemented method of claim 3, wherein the segments from the first group are co-linear with a line that is parallel to a line co-linear with the segments from the second group.

5. The computer-implemented method of claim 4, wherein the physical dimension is a width spanning from a first segment from the first group to a corresponding second segment from the second group.

6. The computer-implemented method of claim 1, further comprising:
   simulating a photolithographic process using the photomask; and
   performing said adjusting positions of segments in the first group and said adjusting positions of segments in the second group in accordance with results of said simulating.

7. The computer-implemented method of claim 6, wherein each segment within the first group is adjusted in position by an amount that is calculated as a function of an edge placement error associated with that segment and wherein each segment within the second group is adjusted in position by an amount that is calculated as a function of a dimensional error associated with that segment.

8. A computer-readable storage medium including a computer program product comprising executable code, wherein the executable code, when executed by a computer, directs the computer to perform actions comprising:
   dividing a perimeter of a region within a photomask into a plurality of segments;
   grouping the plurality of segments into a first group and a second group;
   adjusting positions of segments from the first group such that an edge placement error is minimized; and
   adjusting positions of segments from the second group such that an error in a physical dimension spanning at least a portion of the region is minimized.

9. The computer-readable storage medium of claim 8, wherein the physical dimension is a width of the at least a portion of the region.

10. The computer-readable storage medium of claim 8, wherein the segments from the first group, prior to said adjusting positions of segments from the first group, are co-linear with each other; and wherein the segments from the second group, prior to said adjusting positions of segments from the second group, are co-linear with each other.

11. The computer-readable storage medium of claim 10, wherein the segments from the first group are co-linear with a line that is parallel to a line co-linear with the segments from the second group.

12. The computer-readable storage medium of claim 11, wherein the physical dimension is a width spanning from a first segment from the first group to a corresponding second segment from the second group.

13. The computer-readable storage medium of claim 8, wherein the executable code, when executed by the computer, directs the computer to perform actions of:
   simulating a photolithographic process using the photomask; and
   performing said adjusting positions of segments in the first group and said adjusting positions of segments in the second group in accordance with results of said simulating.

14. The computer-readable storage medium of claim 13, wherein each segment within the first group is adjusted in position by an amount that is calculated as a function of an edge placement error associated with that segment and wherein each segment within the second group is adjusted in position by an amount that is calculated as a function of a dimensional error associated with that segment.

15. A data processing system comprising:
   a memory;
   at least one processor configured to access the memory and execute program code stored in the memory, wherein by executing the program code stored in the memory the at least one processor performs actions comprising:
   dividing a perimeter of a region within a semiconductor photomask into a plurality of segments;
   grouping the plurality of segments into a first group and a second group;
   adjusting positions of segments from the first group such that an edge placement error is minimized; and
   adjusting positions of segments from the second group such that an error in a physical dimension spanning at least a portion of the region is minimized.

16. The data processing system of claim 15, wherein the physical dimension is a width of the at least a portion of the region.

17. The data processing system of claim 15, wherein the segments from the first group, prior to said adjusting positions of segments from the first group, are co-linear with each other; and wherein the segments from the second group, prior to said adjusting positions of segments from the second group, are co-linear with each other.

18. The data processing system of claim 17, wherein the segments from the first group are co-linear with a line that is parallel to a line co-linear with the segments from the second group.

19. The data processing system of claim 18, wherein the physical dimension is a width spanning from a first segment from the first group to a corresponding second segment from the second group.

20. The data processing system of claim 15, wherein the executable code, when executed by the computer, directs the computer to perform actions of:
   simulating a photolithographic process using the photomask; and
   performing said adjusting positions of segments in the first group and said adjusting positions of segments in the second group in accordance with results of said simulating.

* * * * *